(12) United States Patent
Tumakha et al.

(10) Patent No.: US 8,102,019 B1
(45) Date of Patent: Jan. 24, 2012

(54) ELECTRICALLY PROGRAMMABLE DIFFUSION FUSE

(75) Inventors: Serhii Tumakha, San Jose, CA (US); Boon Y. Ang, Sunnyvale, CA (US); Amit Ghia, San Jose, CA (US); Jan L. de Jong, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 242 days.

(21) Appl. No.: 12/488,179

(22) Filed: Jun. 19, 2009

(51) Int. Cl.
*H01L 29/00* (2006.01)
*H01L 27/10* (2006.01)
*H01L 23/525* (2006.01)
*H01L 21/768* (2006.01)
*H01L 21/336* (2006.01)
*H01L 21/82* (2006.01)

(52) U.S. Cl. ............ 257/529; 257/209; 257/E23.147; 257/E21.592; 438/281; 438/132

(58) Field of Classification Search ............ 257/529, 257/209, E23.147, E21.592; 438/281, 132
See application file for complete search history.

(56) References Cited

U.S. PATENT DOCUMENTS

| | | | |
|---|---|---|---|
| 6,433,404 B1 | 8/2002 | Iyer et al. | |
| 6,624,499 B2 | 9/2003 | Kothandaraman et al. | |
| 6,636,433 B2 | 10/2003 | Tanikawa | |
| 6,911,360 B2 * | 6/2005 | Li et al. | 438/238 |
| 7,417,300 B2 | 8/2008 | Booth, Jr. et al. | |
| 7,888,771 B1 * | 2/2011 | Sidhu et al. | 257/529 |
| 7,923,811 B1 * | 4/2011 | Im et al. | 257/529 |
| 2003/0160297 A1 | 8/2003 | Kothandaraman et al. | |
| 2008/0029843 A1 | 2/2008 | Booth, Jr. et al. | |
| 2008/0089159 A1 | 4/2008 | Moy et al. | |
| 2008/0150076 A1 | 6/2008 | Nam et al. | |
| 2008/0186788 A1 | 8/2008 | Barth | |
| 2008/0258255 A1 | 10/2008 | Ker et al. | |
| 2008/0283963 A1 | 11/2008 | Chung et al. | |
| 2009/0001506 A1 | 1/2009 | Kim et al. | |
| 2009/0057818 A1 | 3/2009 | Kim et al. | |
| 2009/0090994 A1 | 4/2009 | Kim et al. | |
| 2009/0224323 A1 * | 9/2009 | Im et al. | 257/355 |
| 2009/0261450 A1 | 10/2009 | Cheng et al. | |
| 2010/0148915 A1 | 6/2010 | Kuo et al. | |

OTHER PUBLICATIONS

U.S. Appl. No. 12/509,301, filed Jul. 24, 2009, Ang et al.

* cited by examiner

*Primary Examiner* — Luan C Thai
(74) *Attorney, Agent, or Firm* — Kevin T. Cuenot

(57) ABSTRACT

A fuse structure for a semiconductor integrated circuit (IC) includes an anode comprising conductive material overlaying a diffusion material disposed within a substrate layer of the IC, wherein the diffusion material is electrically isolated from the substrate layer by at least one p-n junction. The fuse structure can include a cathode comprising conductive material overlaying the diffusion material. The fuse structure further can include a fuse link comprising conductive material overlaying the diffusion material, wherein a first end of the fuse link couples to the anode and a second end of the fuse link, that is distal to the first end, couples to the cathode.

20 Claims, 5 Drawing Sheets

ELECTRICALLY PROGRAMMABLE DIFFUSION FUSE

FIELD OF THE INVENTION

The embodiments disclosed within this specification relate to semiconductor integrated circuits (ICs). More particularly, the embodiments relate to a programmable fuse structure for an IC.

BACKGROUND

Within semiconductor integrated circuits (ICs), fuses can be used to program and permanently store information. Additionally, fuses can be used to form or break electrical connections within ICs. A fuse comprises a fuse link electrically coupling two separate electrical nodes, e.g., an anode and a cathode. Upon the application of a particular stressor to the fuse, the fuse link can be "broken." The break in the fuse link creates an increase in a resistance of a conductive path, possibly an open circuit, between the two electrical nodes. Thus, the fuse has two different programmable states. A first programmable state exists when the fuse has a low resistance in a conductive path through the fuse prior to breaking the fuse link. A second programmable state exists when the fuse has a high resistance in the conductive path through the fuse subsequent to breaking the fuse link.

One type of programmable fuse used within ICs is a laser fuse. The laser fuse is programmed by exposing the material of the fuse link to sufficient laser energy to vaporize the material. However, the level of laser energy necessary to break the fuse link is often capable of damaging devices neighboring the laser fuse being programmed. The need to expose laser fuses to laser energy also prevents laser fuses from being programmed subsequent to IC packaging.

Another type of fuse is the electrically programmable fuse, which is often referred to as an e-fuse. To program the e-fuse, a voltage potential is applied across the conductive fuse link, typically formed of a silicided polysilicon layer, via the cathode and the anode. The applied voltage potential is of sufficient magnitude, and constant polarity, to initiate electromigration and dopant depletion in the silicided polysilicon layer forming the fuse link.

Electromigration refers to a transportation of material by the gradual movement of ions in a conductor due to a momentum transfer between conducting electrons and diffusing metal atoms. Current traveling through the e-fuse generates electromigration effects that migrate silicide material away from one or more portions of the cathode, the anode, or the fuse link regions. The migration results in a higher resistance in the conductive path through the e-fuse. Typically, a large current density is required to flow through the fuse link to induce electromigration within the e-fuse.

SUMMARY

The embodiments disclosed within this specification relate to semiconductor integrated circuits (ICs) and, more particularly, to a programmable fuse structure for an IC. One embodiment of the present invention can include a fuse structure for an IC. The fuse structure can include an anode comprising conductive material overlaying a diffusion material disposed within a substrate layer of the IC. The diffusion material is electrically isolated from the substrate layer by one or more p-n junctions. The fuse structure further can include a cathode comprising conductive material overlaying the diffusion material and a fuse link comprising conductive material overlaying the diffusion material. A first end of the fuse link couples to the anode and a second end of the fuse link, that is distal to the first end, couples to the cathode.

The fuse structure can include a substrate tap comprising at least one contact overlaying a region of the substrate layer. The substrate tap electrically couples the substrate layer to a predetermined voltage potential.

In one aspect, the fuse structure can include a well comprised of an N-type or a P-type material disposed within the substrate layer. In that case, the diffusion material is dispose within the well. One or more p-n junctions are formed by at least one of the diffusion material in contact with the well or the well in contact with the substrate layer.

The fuse structure can include a well tap comprising at least one contact overlaying a region of the well. The well tap electrically couples the well to a predetermined voltage potential.

In another aspect, the diffusion material is a first P-type material, the well is an N-type material, and the substrate layer is a second P-type material. Accordingly, the one or more p-n junctions comprise a first reverse biased p-n junction, formed by the diffusion material in contact with the well, and a second reverse biased p-n junction, formed by the well in contact with the substrate layer.

In another aspect, the diffusion material is a first N-type material, the well is a second N-type material, and the substrate layer is a P-type material. In that case, the one or more p-n junctions comprise a non-forward biased p-n junction formed by the well in contact with the substrate layer.

In yet another aspect, the diffusion material is an N-type material, the well is a first P-type material, and the substrate layer is a second P-type material. The one or more p-n junctions comprise a non-forward biased p-n junction formed by the diffusion material in contact with the well.

The conductive material overlaying the diffusion material demonstrates an electromigration property responsive to an applied programming voltage. The fuse structure further can include a layer of dielectric material surrounding the diffusion material and the conductive material. The dielectric material electrically and physically isolates the diffusion material and the conductive material from at least one neighboring device in a lateral direction.

Another embodiment of the present invention can include a fuse structure for an IC. The fuse structure can include a well comprising an N-type or a P-type material disposed within a substrate layer of the IC and a diffusion material disposed within the well. The diffusion material is electrically isolated from the substrate layer by one or more p-n junctions. The fuse structure can include an anode, disposed within the well, comprising a conductive material overlaying the diffusion material, and a cathode, disposed within the well, comprising the conductive material overlaying the diffusion material. The fuse structure further can include a fuse link, disposed within the well, comprising the conductive material overlaying the diffusion material, wherein a first end of the fuse link couples to the anode and a second end of the fuse link, that is distal to the first end, couples to the cathode.

The conductive material overlaying the diffusion material demonstrates an electromigration property responsive to an applied programming voltage.

The fuse structure can include a layer of dielectric material surrounding the diffusion material and the conductive material, wherein the dielectric material electrically and physically isolates the diffusion material and the conductive material from at least one neighboring device in a lateral direction.

The fuse structure further can include a substrate tap comprising at least one contact overlaying a region of the substrate layer. The substrate tap electrically couples the substrate layer to a predetermined voltage potential.

The fuse structure can include a well tap comprising at least one contact overlaying a region of the well. The well tap electrically couples the well to a predetermined voltage potential.

In one aspect, the diffusion material is a first P-type material, the well is an N-type material, and the substrate layer is a second P-type material. In that case, the one or more p-n junctions comprise a first reverse biased p-n junction, formed by the well in contact with the diffusion material, and a second reverse biased p-n junction, formed by the well in contact with the substrate layer.

In another aspect, the diffusion material is a first N-type material, the well is a second N-type material, and the substrate layer is a P-type material. The one or more p-n junctions comprise a non-forward biased p-n junction formed by the well in contact with the substrate layer.

In yet another aspect, the diffusion material is an N-type material, the well is a first P-type material, and the substrate layer is a second P-type material. The one or more p-n junctions comprise a non-forward biased p-n junction formed by the well in contact with the diffusion material.

Another embodiment of the present invention can include a method of providing a fuse structure for an IC. The method can include forming a well comprising an N-type or a P-type material disposed within a substrate layer of the IC and disposing a diffusion material within the well. The method can include forming an anode, within the well, comprising conductive material overlaying the diffusion material and forming a cathode, within the well, comprising conductive material overlaying the diffusion material. The method further can include forming a fuse link, within the well, comprising conductive material overlaying the diffusion material, wherein a first end of the fuse link is coupled to the anode and a second end of the fuse link, that is distal to the first end, is coupled to the cathode. One or more p-n junctions that electrically isolate the diffusion material from the substrate layer can be created.

The method can include forming a substrate tap comprising at least one substrate contact overlaying a region of the substrate layer. The method further can include forming a well tap comprising at least one contact overlaying a region of the well.

The method can include forming a layer of dielectric material surrounding the diffusion material and the conductive material, wherein the dielectric material electrically and physically isolates the diffusion material and the conductive material from at least one neighboring device in a lateral direction.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the embodiments of the invention.

The embodiments disclosed within this specification relate to semiconductor integrated circuits (ICs) and, more particularly, to a fuse structure for ICs. In accordance with the inventive arrangements, a fuse structure can be constructed directly upon a substrate layer of an IC. The fuse structure can include an anode and a cathode coupled by a fuse link. Each of the anode, the cathode, and the fuse link can include a conductive material that is susceptible to electromigration effects and that overlays a diffusion material. Using a p-n junction, the fuse structure can be electrically isolated from surrounding IC devices without the use of dielectric layers such as, for example, field or gate oxide layers, disposed under the anode, the cathode, or the fuse link of the fuse structure.

In cases where the type of diffusion material used to implement the anode, the cathode, the fuse link, and the substrate layer do not provide at least one p-n junction, an optional well can be added to the fuse structure. The well creates the p-n junction lacking within such a fuse structure. The fuse structure provides a programmable fuse that can be ported across a variety of semiconductor manufacturing processes.

Figure 1:
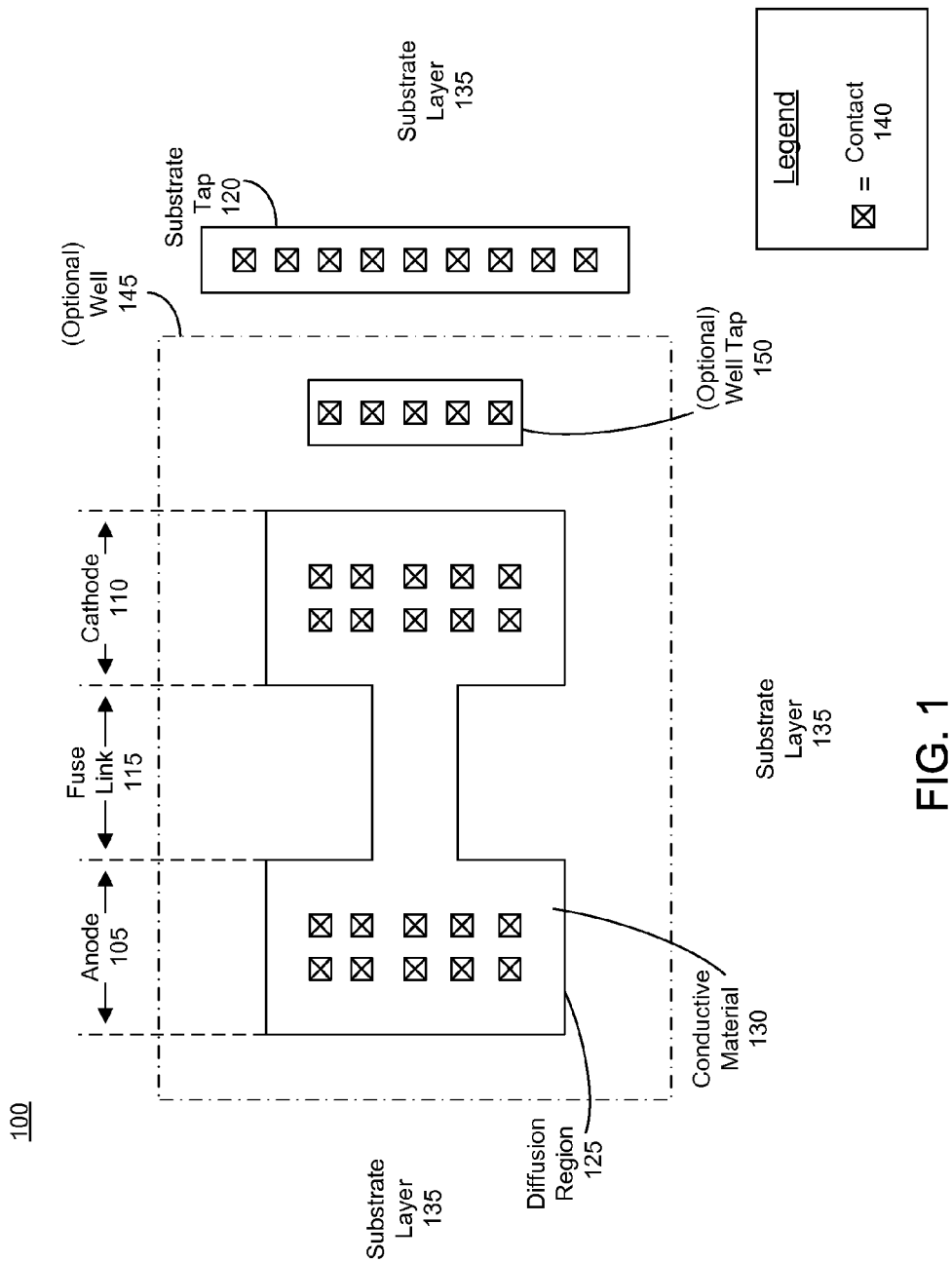
FIG. 1 is a topographical view illustrating a fuse structure for use within a semiconductor integrated circuit (IC) in accordance with one embodiment of the present invention.

FIG. 1 is a topographical view illustrating a fuse structure (fuse) 100 for use within an IC in accordance with one embodiment of the present invention. Fuse 100 is a programmable, electronic fuse that can be implemented without a dielectric isolation layer separating the anode, the cathode, and the fuse link of the fuse structure from an underlying substrate layer.

Fuse 100 can include an anode 105, a cathode 110, and a fuse link 115. Anode 105, cathode 110, and fuse link 115 each can be formed of a conductive material 130 that overlays a diffusion region 125. As pictured, anode 105 and cathode 110 are coupled to opposing ends of fuse link 115. Additionally, as conductive material 130 overlays diffusion region 125, a perimeter of conductive material 130 is presented in FIG. 1 as being co-located with a perimeter of diffusion region 125. As such, diffusion region 125, being directly beneath conductive material 125, is hidden from view.

In one aspect, diffusion region 125 can be disposed within an optional well 145. Well 145 can include an N-type or P-type material disposed within substrate layer 135. Fuse 100 can include an optional well tap 150 through which the N-type or P-type material of well 145 can be biased to a desired voltage potential. Fuse 100 also can include substrate tap 120 through which substrate layer 135 can be biased to a desired voltage potential. Through application of appropriate bias voltage levels to well 145 and substrate layer 135, one or more p-n junctions that are not forward biased (non-forward biased p-n junctions) can be created that electrically isolate anode 105, cathode 110, and fuse link 115 from neighboring devices or voltage potentials contained within substrate layer 135.

The term "junction," as used within this specification, refers to contact of a surface of a region of a first N-type or P-type material with a surface of a region of a second N-type or P-type material. A p-n junction is formed when a first of the two materials is an N-type material and the second of the two materials is a P-type material. The phrase "substrate layer," as used within this specification, refers to a base or bottom diffusion layer of a semiconductor silicon wafer within, and upon, which an IC is constructed. The term "well," as used within this specification, refers to a tub of N-type or P-type material disposed within an IC substrate layer or an N-type or P-type material that is different from the N-type or P-type material forming the well.

Anode 105 and cathode 110 can be made of, or include, conductive material 130 deposited and processed atop a diffusion material forming diffusion region 125. In one embodiment, the conductive material 130 of anode 105 and cathode 110 is in direct contact with the diffusion region 125. Conductive material 130 can include any conductive material used as an IC process layer that can be deposited and processed to overlay a diffusion material in a manner that electrically couples the conductive material to the diffusion material. Conductive material 130 is, or includes, a material that is susceptible to electromigration effects.

For example, various metal silicides that exhibit electromigration effects can be deposited upon diffusion material and serve as conductive material 130. Within fuse 100, the diffusion material can be either an N-type or a P-type diffusion material, either of which is well known in IC manufacturing processes. In addition, the diffusion material used to implement fuse 100 can contain various levels of dopants, either N-type or P-type. As pictured in FIG. 1, anode 105 and cathode 110 each can include one or more contact(s) 140. Contact(s) 140 can couple anode 105 and cathode 110 to metal interconnect lines within the IC.

Fuse link 115 can be formed of a conductive material as described with reference to anode 105 and cathode 110. Fuse link 115 forms a channel or conductive path coupling anode 105 and cathode 110. More particularly, a first end of fuse link 115 is coupled to anode 105. A second end of fuse link 115, distal to the first end, is coupled to cathode 110. The dimensions of fuse link 115 can vary in length, width, thickness, geometric shape, or the like. In this regard, the physical characteristics of fuse link 115, as shown in FIG. 1, are for purposes of illustration only and are not intended to limit the embodiments disclosed. For example, the dimensions of fuse link 115 can be determined by a variety of desired performance parameters for fuse 100. These performance parameters can include, but are not limited to, programming voltage, current density within fuse link 115 during programming, resistance of a conductive path through fuse 100 prior to, and subsequent to, programming, electromigration properties of conductive material 130.

Diffusion region 125 can be a continuous region of diffusion material formed directly beneath conductive material 130 that is used to form anode 105, cathode 110, and fuse link 115. Conductive material 130 can be aligned to completely overlay diffusion region 125.

Substrate tap 120 can be formed as a silicided substrate region with one or more contact(s) 140 that couple substrate layer 135 to metal interconnect lines within the IC. Substrate tap 120 can be coupled to a predetermined voltage potential provided within the IC, thereby biasing substrate layer 135 to the predetermined voltage potential.

In operation, a programming voltage can be applied across anode 105 and cathode 110. As used within this specification, the phrase "programming voltage," refers to a voltage potential applied across fuse 100, i.e., across anode 105 and cathode 110, that generates a current flow through fuse 100 of sufficient density to induce electromigration of conductive material across fuse link 115. The movement of conductive material across, and away from, the area occupied by fuse link 115, results in an increase in the resistance of the conductive path between anode 105 and cathode 110. Accordingly, "programming" or "to program" a fuse, refers to a one time application of a programming voltage to the fuse in order to "break" or change the resistance of the conductive path through the fuse. During programming of a fuse, the programming voltage can be measured in terms of magnitude and time of application so that the resistance of the conductive path between anode 105 and cathode 110 increases by a predetermined or expected amount, or increases within a predetermined or known range.

For example, in a conventional fuse programming circuit, an electronically programmable fuse (e-fuse) can be coupled in series with a metal oxide field effect transistor (MOSFET) switch (not shown). The MOSFET and e-fuse in series are coupled across a power supply, i.e., a programming voltage, provided within the IC. An anode of the e-fuse can be coupled to a most positive potential of the power supply and a cathode of the e-fuse can be coupled to the drain terminal of the MOSFET switch. The source terminal of the MOSFET can be coupled to the most negative potential of the power supply. In order to program the e-fuse, a bias voltage can be applied to the gate terminal of the MOSFET switch, thereby enabling current flow through the MOSFET switch and the e-fuse. Typically, in conventional fuse programming circuits, the gate terminal of the MOSFET switch is biased to fully enable the MOSFET switch. In that case, a voltage potential appearing across the anode and the cathode of the e-fuse is approximately equal to the voltage potential of the power supply. Accordingly, the programming voltage applied to the e-fuse is approximately equal to the voltage potential of the power supply. Additionally, the current through the e-fuse is approximately equal to the current through the MOSFET switch.

When programming an e-fuse, the programming voltage, and the current generated by the application of the programming voltage, must be controlled in order to induce a desired increase in the resistance of the conductive path through the e-fuse subsequent to application of the programming voltage. In conventional e-fuses, a dielectric layer is horizontally positioned between the e-fuse structure and the substrate layer over which the e-fuse is implemented, e.g., parallel to the substrate layer. The dielectric layer electrically isolates the conventional e-fuse from neighboring IC devices, or voltage potentials, occurring in the substrate surrounding the conventional e-fuse.

Without dielectric isolation, currents generated during programming of a conventional e-fuse can bypass the fuse link between the anode and the cathode and flow to neighboring IC devices, possibly damaging the neighboring devices.

Accordingly, the quantity of current bypassing the fuse link is influenced by the number and type of devices neighboring the e-fuse. As a result, the quantity of current flowing through the fuse link becomes unpredictable and can vary according to the location of the e-fuse within the IC. Unpredictable programming currents produce unpredictable levels of electromigration of conductive material within the e-fuse. This can result in variations in the resistance of the conductive path through the conventional e-fuse subsequent to programming, and thus, an unreliable e-fuse.

Typically, conventional poly-based e-fuses are implemented using processing layers that generate gate structures, or a "gate stack," within an IC manufacturing process flow. A gate stack refers to the process layers used to implement the gate terminal of a MOSFET device. The process layers in the gate stack can include, at least, a dielectric layer, a polysilicon layer, and a layer of metal silicide or other conductive material. Accordingly, the anode and the cathode of the conventional e-fuse can be constructed with the metal silicide and polysilicon layers of the process flow. Dielectric isolation of the conventional e-fuse is provided by the field or gate oxide layer of the process flow.

In modern submicron IC processes, a variety of process steps have been added to offset effects created by reductions in MOSFET device sizing, e.g., short channel effects, leakage currents, and the like. For example, high-k dielectrics and metal layers can be used to implement gate stacks in modern IC processes that are not consistently included within IC manufacturing processes. As a result, the requirements for the gate stack layers of an IC process flow can be in conflict with the performance needs of a conventional e-fuse that is implemented with the process layers of the gate stack. In addition, the variation in gate stack layers from one IC manufacturing process to another can create difficulties when porting conventional e-fuse structures between different IC manufacturing processes.

In fuse 100, substrate tap 120 can be coupled to a voltage potential that creates a non-forward biased p-n junction between fuse 100 and substrate layer 135. The non-forward biased p-n junction can create junction isolation that electrically isolates fuse 100 from neighboring IC devices residing within substrate layer 135. Junction isolation ensures that current generated during an application of a programming voltage to fuse 100 has no available path other than the conductive path through fuse 100 and, as a result, does not deviate from the conductive path through fuse 100. Accordingly, current generated within fuse 100 during programming is restricted to flowing from anode 105 to cathode 110 via fuse link 115.

Fuse 100 can provide electrical isolation from devices within the surrounding substrate layer 135. The junction isolation of fuse 100 assures that predictable currents flow though fuse 100 during programming, thereby leading to predictable electromigration effects by the currents. Predictability of electromigration effects during programming of fuse 100 leads to predictability in the amount of resistive increase that occurs subsequent to programming and, accordingly, a reliable fuse. In addition, anode 105, cathode 110, and fuse link 115, each being implemented with a conductive layer directly overlaying diffusion material, correlate to process layers consistently found within a plurality of different modern IC processes. As a result, fuse 100 is easily portable across differing IC manufacturing processes. For example, most modern IC manufacturing processes contain a MOSFET device. The drain and source terminal of the MOSFET device typically include a silicide layer overlaying a diffusion region and, as such, inherently provide process layers with which to implement anode 105, cathode 110, and fuse link 115 of fuse 100.

As noted, diffusion region 125 can be disposed within substrate layer 135 without optional well 145. In some cases, however, the combination of N-type or P-type materials used to implement diffusion region 125 and substrate layer 135 may not form a p-n junction. In those cases, optional well 145 and optional well tap 150 can be included in fuse 100. Well 145 can be disposed within substrate layer 135 and diffusion region 125 can be disposed within well 145. When implemented with an appropriate diffusion material, the addition of well 145 to fuse 100 provides an additional interface at which a reverse biased p-n junction can be formed to electrically isolate diffusion region 125 from substrate layer 135.

Well tap 150 can be implemented using a conductive layer and one or more contact(s) 140 that can electrically couple the N-type or P-type material forming well 145 to a predetermined voltage potential. Depending upon the N-type or P-type material used to implement diffusion region 125, well 145, and substrate 135, and the voltage potential applied to each, one or more non-forward biased p-n junction(s) can be created that electrically isolate the diffusion region 125 from substrate layer 135. As such, fuse 100 can be implemented with a variety of diffusion materials while still providing electrical isolation from neighboring IC devices. In addition, the electrical isolation provided by fuse 100 can be achieved without the use of a dielectric isolation layer horizontally disposed under anode 105, cathode 110, and fuse link 115.

Figure 2:
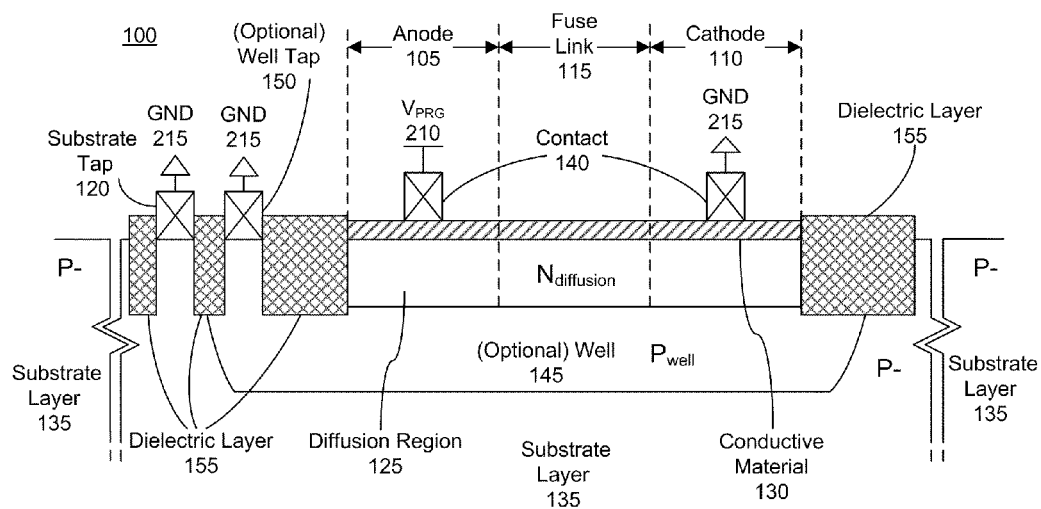
FIG. 2 is a first cross-sectional side view illustrating a fuse structure for use within an IC in accordance with another embodiment of the present invention.

FIG. 2 is a first cross-sectional side view illustrating a fuse for use within an IC in accordance with another embodiment of the present invention. More particularly, FIG. 2 illustrates another embodiment of fuse 100 described with reference to FIG. 1. Like numbers will be used to refer to the same items throughout this specification. As presented in cross-sectional view, fuse 100 can include dielectric layer 155. In one embodiment, dielectric layer 155 can be formed of field oxide. As much of dielectric layer 155 is co-located over substrate layer 135, dielectric layer 155 was omitted from FIG. 1 to provide a more understandable description and illustration of fuse 100.

FIG. 2 illustrates an embodiment of fuse 100 wherein diffusion region 125 is implemented as an N-type diffusion material and substrate layer 135 is implemented as a P-type substrate. Optional well 145 is implemented as a P-type material formed within substrate layer 135. Implemented in this manner, fuse 100 contains a p-n junction at the region of contact between well 145 and diffusion region 125.

To program fuse 100, a voltage potential can be coupled across anode 105 and cathode 110. Thus, as pictured, a programming voltage denoted as $V_{PRG}$ 210 is coupled to anode 105 while cathode 215 is coupled to ground, denoted as GND 215. Accordingly, the voltage potential across diffusion region 125, moving from anode 105 to cathode 110, varies between $V_{PRG}$ 210 and GND 215. As well 145 is coupled to GND 215, the voltage potential across the p-n junction formed by the region of contact between well 145 and diffusion region 125 cannot exceed zero volts. Accordingly, the p-n junction formed by well 145 and diffusion region 125 cannot be forward biased, thereby isolating diffusion region 125 from substrate layer 135.

The isolation provided by the p-n junction formed by the region of contact between well 145 and diffusion region 125 electrically isolates diffusion region 125. With diffusion region 125 electrically isolated, current flowing into anode 105 is assured to flow though fuse link 115 and exit fuse 100 through cathode 110. As such, the current generated by the programming voltage reliably and reproducibly flows through fuse link 115 during programming of fuse 100. A reproducible current flow through fuse link 115 results in a reliable and reproducible quantity of conductive material 130 electromigrating across anode 105, cathode 110, and fuse link 115 during programming, and thus, a reliable and reproducible increase in the resistance of the conductive path through fuse 100 subsequent to programming.

Referring to FIG. 2, optional well 145 and substrate layer 135 are both implemented with P-type material, although the doping density of the P-type material within each region may be dissimilar. Implemented in this manner, a p-n junction does not exist between well 145 and substrate layer 135. Thus, in another embodiment, well 145 may not be required for proper operation of fuse 100 and, therefore, can be excluded. In that case, substrate layer 135 can be in direct contact with, and surround, diffusion region 125. With well 145 excluded, a p-n junction is then formed at the region of contact between the N-type material of diffusion region 125 and the P-type material of substrate layer 135.

Without the inclusion of electrical isolation via one or more p-n junctions, the operation of fuse 100 can be affected by IC devices within areas of substrate layer 135 neighboring fuse 100. For example, consider an embodiment of fuse 100 where the N-type diffusion material of diffusion region 125 is replaced with a P-type diffusion material. With diffusion region 125 implemented as a P-type diffusion material, fuse 100 lacks a p-n junction with which to electrically isolate fuse 100 from substrate layer 135. Upon application of $V_{PRG}$ 210 to anode 105, anode 105 is at a voltage approximately equal to $V_{PRG}$ 210. Well 145 is coupled to GND 215 via optional well tap 150. Substrate layer 135 is coupled to GND 215 via substrate tap 120. As a voltage differential exists between anode 105 and well 145, current, denoted as $I_{short}$, flows from anode 105, through well 145, to well tap 150. Similarly, $I_{short}$ flows from anode 105, through substrate layer 135, to substrate tap 120.

Other IC devices, within either well 145 or substrate layer 135 that may be coupled to a voltage potential less than $V_{PRG}$ 210 can create a current path generating, or contributing to, $I_{short}$. $I_{short}$ denotes a portion of a current entering anode 105 during programming of fuse 100 that is diverted away from fuse link 115 and cathode 110. Accordingly, the quantity of $I_{short}$ generated in fuse 100 is affected by the voltage potential associated with each device neighboring fuse 100 as well as the distance from the neighboring devices to fuse 100. The presence of $I_{short}$ during the programming of fuse 100 results in inconsistent current flow through fuse link 115 during the programming process. Inconsistent current flow though fuse link 115 during programming can result in inconsistent changes in the resistance of the current path through fuse 100 subsequent to programming. Further, $I_{short}$ may damage other devices neighboring fuse 100. As such, one or more p-n junctions are required to assure the change in resistance seen in each implementation of fuse 100 subsequent to programming is not affected by neighboring objects within the substrate layer of the IC.

Additionally, to provide lateral isolation of diffusion region 125 and conductive layer 130 from substrate layer 135, dielectric layer 155 can be included within fuse 100. Dielectric layer 155 can be implemented with any bulk dielectric material available within an IC manufacturing process that can physically and electrically isolate diffusion and conductive layers of an IC manufacturing process from the surrounding substrate layer of the IC, for example, field oxide. The dielectric layer 155 can electrically and physically isolate the diffusion region 125 and the conductive material 130 from at least one neighboring device in a lateral direction. At a minimum, dielectric layer 155 can vertically surround diffusion region 125 and conductive layer 130. As illustrated in FIG. 2, dielectric layer 155 surrounds the entirety of fuse 100 excepting a region directly over conductive layer 130 and openings in dielectric layer 155 used to couple substrate tap 120 to substrate layer 135 as well as well tap 150 to well 145. Additionally, dielectric layer 155 can extend beyond the vertical edges of well 145 to assure no lateral conduction path exists between diffusion region 125 and substrate layer 135.

Figure 3:
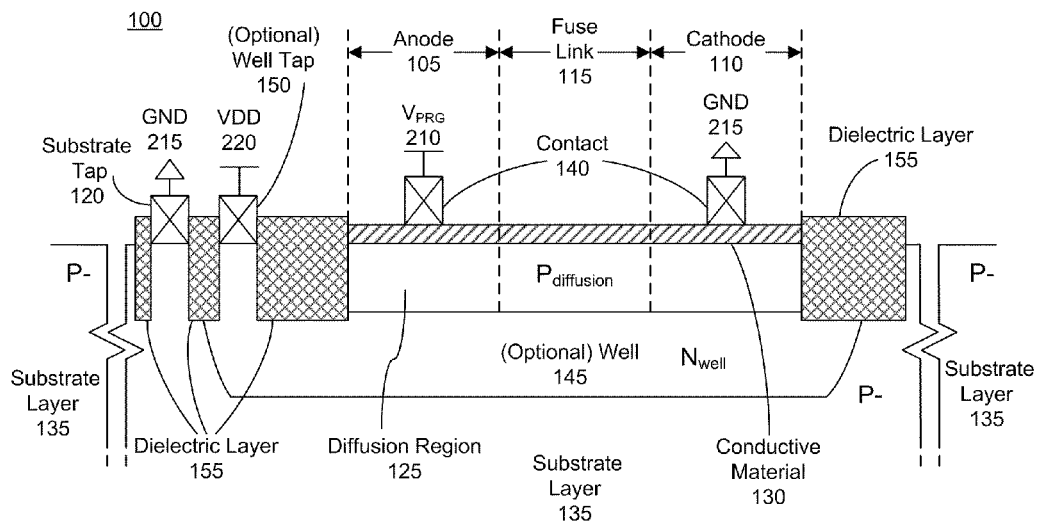
FIG. 3 is a second cross-sectional side view illustrating a fuse structure for use within an IC in accordance with another embodiment of the present invention.

FIG. 3 is a second cross-sectional side view illustrating a fuse for use within an IC in accordance with another embodiment of the present invention. More particularly, FIG. 3 illustrates another embodiment of fuse 100 described with reference to FIG. 1. As pictured in FIG. 3, fuse 100 is implemented with a P-type material forming diffusion region 125 and an N-type material forming well 145. Substrate layer 135 is formed of a P-type material. As both diffusion region 125 and substrate layer 135 are formed of a P-type material, the embodiment of fuse 100 presented in FIG. 3 requires optional well 145 in order to introduce an N-type material with which to implement a p-n junction within fuse 100.

As illustrated in FIG. 3, fuse 100 contains two p-n junctions. A first p-n junction occurs at a region of contact between diffusion region 125 and well 145. A second p-n junction occurs at a region of contact between well 145 and substrate layer 135. With anode 105 coupled to $V_{PRG}$ 210, and $V_{PRG}$ 210 being a voltage potential less than VDD 220, the maximum voltage seen at the first p-n junction at the region of contact between diffusion region 125 and well 145 is less than zero volts. As such, the first p-n junction at the region of contact between diffusion region 125 and well 145 is reverse biased and electrically isolates diffusion region 125 from substrate layer 135.

Additionally, with well 145 coupled to VDD 220 and substrate layer 135 coupled to GND 215, the voltage potential across the second p-n junction at the region of contact between well 145 and substrate layer 135 is approximately equal to VDD 220. As such, the second p-n junction at the region of contact between well 145 and substrate layer 135 is reverse biased and electrically isolates diffusion region 125 from substrate layer 135. It should be noted that when reverse biasing a p-n junction, the level of reverse biasing should not exceed the reverse junction breakdown voltage of the p-n junction. Excessive levels of reverse biasing can lead to a physical or electrical breakdown of the junction isolation provided by the p-n junction.

It should be appreciated that although the embodiment of fuse 100 presented in FIG. 3 contains two p-n junctions, only one p-n junction is necessary to electrically isolate diffusion region 125 from substrate layer 135. However, when two p-n junctions are present, such as in the embodiment of fuse 100 presented in FIG. 3, greater electrical isolation is provided than with embodiments of fuse 100 implemented with a single p-n junction.

Figure 4:
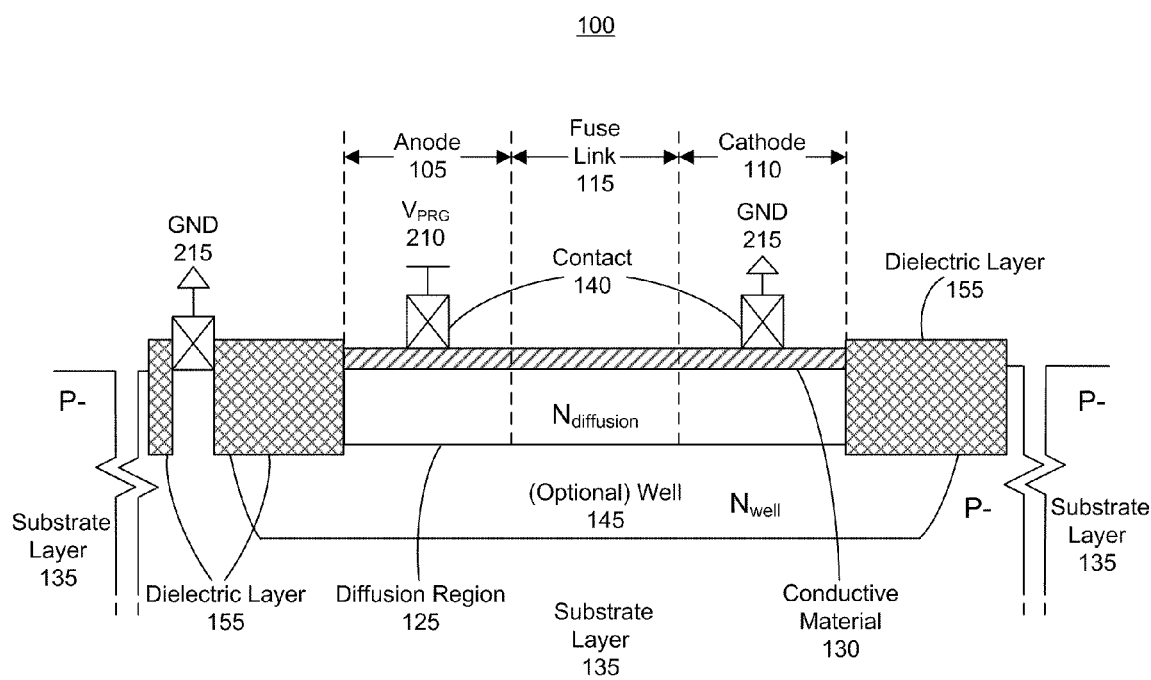
FIG. 4 is a third cross-sectional side view illustrating a fuse structure for use within an IC in accordance with another embodiment of the present invention.

FIG. 4 is a third cross-sectional side view illustrating a fuse for use within an IC in accordance with another embodiment of the present invention. More particularly, FIG. 4 illustrates another embodiment of fuse 100 described with reference to FIG. 1. In FIG. 4, fuse 100 is implemented with an N-type material forming diffusion region 125 and an N-type material forming well 145. Substrate layer 135 is formed of a P-type material.

As illustrated in FIG. 4, fuse 100 contains a p-n junction at a region of contact between well 145 and substrate layer 135. As illustrated within FIG. 4, optional well tap 150 is foregone and well 145 is floated, i.e., not coupled to any voltage potential. Substrate layer 135 is coupled to GND 215. As diffusion region 125 and well 145 form a continuous region of N-type material, diffusion region 125 and well 145 are electrically coupled. With diffusion region 125 and well 145 electrically coupled, the voltage potential across well 145 varies between $V_{PRG}$ 210 and GND 215. Accordingly, the voltage potential across the p-n junction at a region of contact between well 145 and substrate layer 135 does not exceed 0 volts. As such, the p-n junction at the region of contact between well 145 and substrate layer 135 is not forward biased, thereby electrically isolating diffusion region 125 from substrate layer 135.

Figure 5:
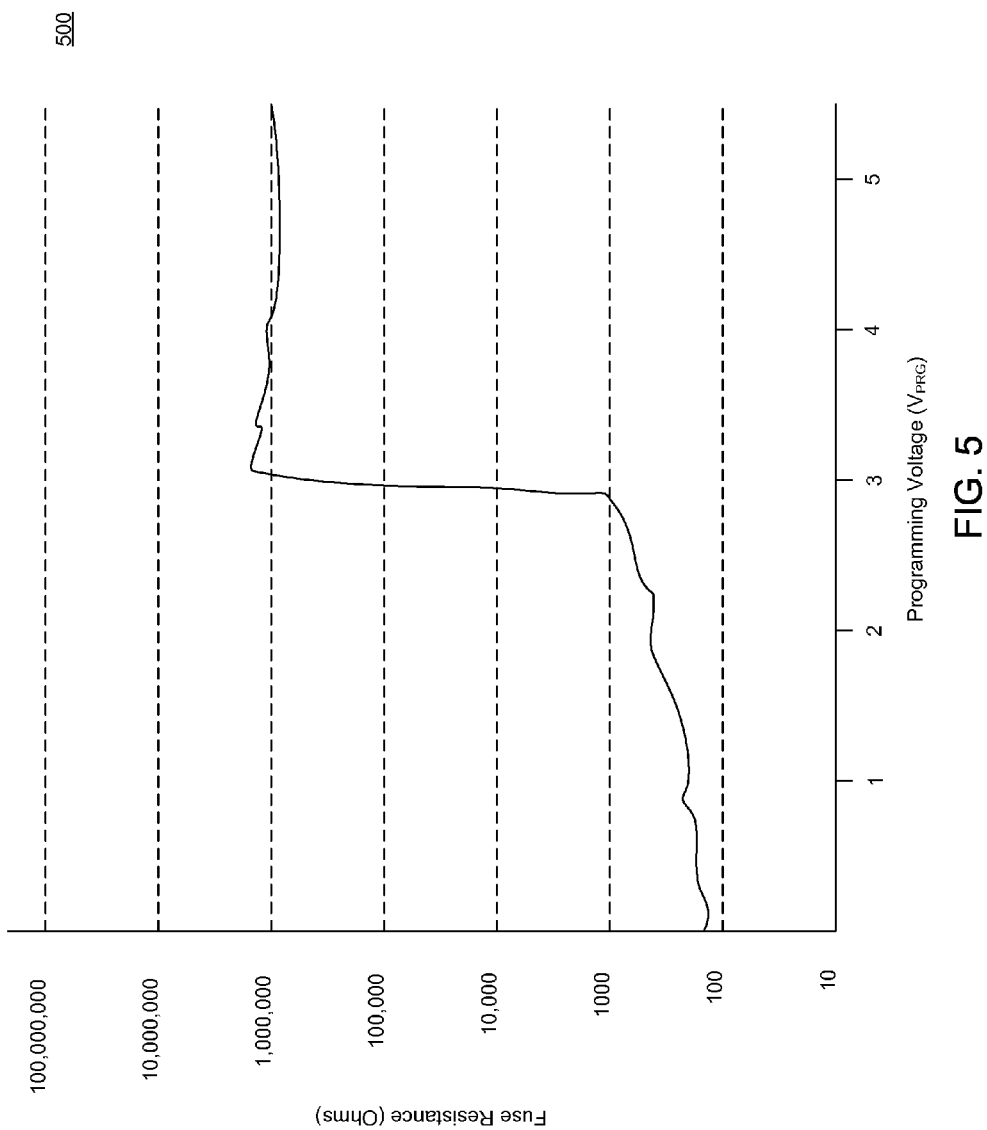
FIG. 5 is a graph illustrating resistive changes within a fuse structure in response to an applied programming voltage in accordance with another embodiment of the present invention.

FIG. 5 is a graph 500 illustrating resistive changes within a fuse structure in response to an applied programming voltage in accordance with another embodiment of the present invention. FIG. 5 illustrates the resistive change that can be achieved within one of the fuses described with reference to any of FIG. 1, 2, 3, or 4. Graph 500 illustrates a quantity of resistance increase in a conductive path through such a fuse that can be achieved subsequent to programming. The values of the resistive change presented within graph 500 are exemplary only and can vary according to design parameters used to implement the fuse as well as the IC manufacturing process used to implement the fuse. As such, graph 500 is not intended to be limiting, but rather to provide an understandable description of the embodiments of the invention. Within graph 500, the vertical axis represents the resistance of a conductive path through the fuse. The horizontal axis represents the programming voltage $V_{PRG}$ that is applied to the fuse.

Graph 500 represents a programming voltage, applied across an anode and a cathode of the fuse, wherein the programming voltage is increased from 0-5 volts and the current flowing through the fuse is measured and recorded. Using the current measurements, the resistance of the fuse structure for each value of the programming voltage can be calculated. The calculated resistance of the conductive path through the fuse at each level of programming voltage applied to the fuse is plotted in graph 500.

As illustrated in graph 500, the resistance of the conductive path through the fuse prior to programming is approximately 100 ohms. As the programming voltage applied to the fuse is increased, the current generated within the fuse by the programming voltage $V_{PRG}$ also increases, which increases the amount of conductive material of the fuse link that electromigrates. The increased electromigration effect manifests itself in Graph 500 in the form of increased resistance of the conductive path through the fuse.

At approximately 3 volts of programming voltage, an inflection point occurs within graph 500. At the 3 volt inflection point, the resistance of the conductive path through the fuse significantly increases from approximately 1K ohm to approximately 1M ohm. The increase in resistance from 1K ohm to 1M ohm illustrates a programming voltage that displaces sufficient conductive material through electromigration to cause a "break" in the conductive material along the fuse link of the fuse. The two values for the resistance of the conductive path through the fuse prior to, and subsequent to, the 3 volt inflection point in graph 500, i.e., 1K ohm and 1M ohm, represent two possible programming states for the fuse. Accordingly, the state of the fuse, as embodied with respect to graph 500, can be changed with a programming voltage of approximately 3 volts or more.

Figure 6:
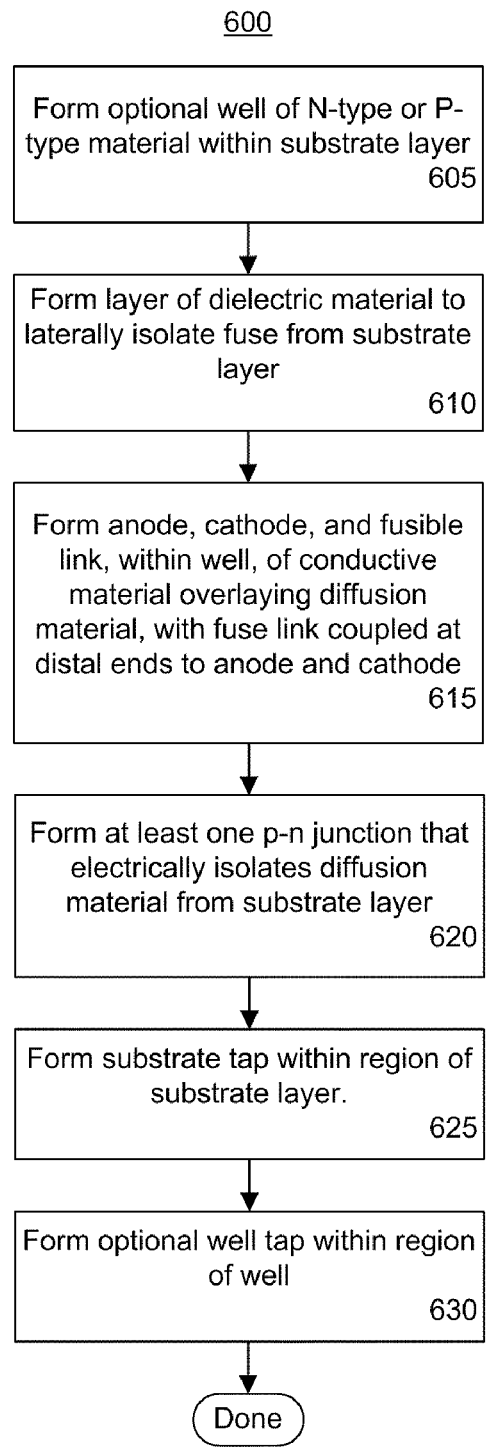
FIG. 6 is a flow chart illustrating a method of providing a fuse structure for use within an IC in accordance with another embodiment of the present invention.

FIG. 6 is a flow chart illustrating a method 600 of providing a fuse structure for use within an IC in accordance with another embodiment of the present invention. More particularly, method 600 describes a technique for constructing a programmable fuse structure within an IC. Method 600 can begin in a state where a fuse as described with reference to FIGS. 1-5 is to be constructed upon or within a wafer comprising a substrate layer.

Beginning in step 605, a layer of dielectric material can be formed on the wafer that electrically and physically isolates an anode, a cathode, and a fuse link of the fuse from neighboring devices in a lateral direction. The dielectric layer can vertically surround a conductive material overlaying a diffusion material associated with the anode, the cathode, and the fuse link of the fuse.

In step 610, a well optionally can be formed within the substrate layer of the wafer. The well can be either a P-type or an N-type material. The type of material used to implement the optional well is dependent upon the material type of the substrate layer and a diffusion material used to form the anode, the cathode and the fuse link of the fuse structure. Depending upon the material type of the substrate layer and the diffusion material, the optional well can be implemented with an appropriate material to create at least one p-n junction within the fuse structure.

In step 615, the anode, the cathode, and the fuse link can be formed of conductive material overlaying the diffusion material. The fuse link can be coupled to the anode at a first end and coupled to the cathode at a second end, distal to the first end. In one embodiment, the diffusion material and the substrate layer can form a p-n junction. In that case, the optional well can be eliminated as the p-n junction formed by the diffusion material and the substrate layer can provide electrical isolation of the diffusion material from the substrate layer.

In step 620, the diffusion material can be electrically isolated from the substrate layer by one or more p-n junctions formed within the fuse structure. The p-n junction(s) can be formed by at least one of either of a region of contact between the well and the diffusion material or a region of contact between the well and the substrate layer. Additionally, during operation, appropriate bias voltages can be applied to each material comprising each side of the p-n junction in order to assure the p-n junction(s) are not forward biased. The p-n junction(s) can electrically isolate the diffusion material from the substrate layer of the IC within which the fuse structure is implemented.

In step 625, a substrate tap can be formed within a region of the substrate layer. The substrate tap can include one or more contact(s) that, during operation, couple the substrate layer to a predetermined voltage potential. In step 630, an optional well tap can be formed within a region of well. The well tap can include one or more contact(s) that, during operation, couple the well to a predetermined voltage potential. The contact(s) of the substrate tap and well tap can be coupled to the substrate layer and the well, respectively, through openings in the dielectric layer formed in step 605.

It should be noted that, in some alternative implementations, the functions noted in the blocks of the flowchart may occur out of the order noted in the figures. For example, two blocks shown in succession may, in fact, be executed substantially concurrently, or the blocks may sometimes be executed in the reverse order, depending upon the functionality involved.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements. Two elements, for example, can be coupled mechanically, electrically, or communicatively linked through a communication channel, pathway, network, or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A fuse structure for a semiconductor integrated circuit (IC), the fuse structure comprising:
   an anode comprising conductive material overlaying a diffusion material disposed within a substrate layer of the IC, wherein the diffusion material is electrically isolated from the substrate layer by at least one p-n junction;
   a cathode comprising conductive material overlaying the diffusion material; and
   a fuse link comprising conductive material overlaying the diffusion material, wherein a first end of the fuse link couples to the anode and a second end of the fuse link, that is distal to the first end, couples to the cathode,
   wherein the anode, the cathode, and the fuse link are not separated from the diffusion material by a dielectric layer.

2. The fuse structure of claim 1, wherein the anode, cathode, and the fuse link are directly above the diffusion material.

3. The fuse structure of claim 1, further comprising a well comprised of an N-type or a P-type material disposed within the substrate layer, wherein the diffusion material is dispose within the well, and wherein the at least one p-n junction is formed by at least one of the diffusion material in contact with the well or the well in contact with the substrate layer.

4. The fuse structure of claim 3, further comprising a well tap comprising at least one contact overlaying a region of the well, wherein the well tap electrically couples the well to a predetermined voltage potential.

5. The fuse structure of claim 3, wherein the diffusion material is a first P-type material, the well is an N-type material, and the substrate layer is a second P-type material, and wherein the at least one p-n junction comprises a first reverse biased p-n junction, formed by the diffusion material in contact with the well, and a second reverse biased p-n junction, formed by the well in contact with the substrate layer.

6. The fuse structure of claim 3, wherein the diffusion material is a first N-type material, the well is a second N-type material, and the substrate layer is a P-type material, and wherein the at least one p-n junction comprises a non-forward biased p-n junction formed by the well in contact with the substrate layer.

7. The fuse structure of claim 3, wherein the diffusion material is an N-type material, the well is a first P-type material, and the substrate layer is a second P-type material, and wherein the at least one p-n junction comprises a non-forward biased p-n junction formed by the diffusion material in contact with the well.

8. The fuse structure of claim 1, wherein the conductive material overlaying the diffusion material demonstrates an electromigration property responsive to an applied programming voltage.

9. The fuse structure of claim 1, further comprising a layer of dielectric material surrounding the diffusion material and the conductive material, wherein the dielectric material electrically and physically isolates the diffusion material and the conductive material from at least one neighboring device in a lateral direction.

10. A fuse structure for a semiconductor integrated circuit (IC), the fuse structure comprising:
    a well comprised of an N-type or a P-type material disposed within a substrate layer of the IC;
    a diffusion material disposed within the well, wherein the diffusion material is electrically isolated from the substrate layer by at least one p-n junction;
    an anode, disposed within the well, comprising a conductive material overlaying the diffusion material;
    a cathode, disposed within the well, comprising the conductive material overlaying the diffusion material; and
    a fuse link, disposed within the well, comprising the conductive material overlaying the diffusion material, wherein a first end of the fuse link couples to the anode and a second end of the fuse link, that is distal to the first end, couples to the cathode,
    wherein the anode, the cathode, and the fuse link are not separated from the diffusion material by a dielectric layer.

11. The fuse structure of claim 10, wherein the conductive material overlaying the diffusion material demonstrates an electromigration property responsive to an applied programming voltage.

12. The fuse structure of claim 10, further comprising a layer of dielectric material surrounding the diffusion material and the conductive material, wherein the dielectric material electrically and physically isolates the diffusion material and the conductive material from at least one neighboring device in a lateral direction.

13. The fuse structure of claim 10, wherein the anode, the cathode, and the fuse link are directly above the diffusion material.

14. The fuse structure of claim 10, further comprising a well tap comprising at least one contact overlaying a region of the well, wherein the well tap electrically couples the well to a predetermined voltage potential.

15. The fuse structure of claim 10, wherein the diffusion material is a first P-type material, the well is an N-type material, and the substrate layer is a second P-type material, and wherein the at least one p-n junction comprises a first reverse biased p-n junction, formed by the well in contact with the diffusion material, and a second reverse biased p-n junction, formed by the well in contact with the substrate layer.

16. The fuse structure of claim 10, wherein the diffusion material is a first N-type material, the well is a second N-type material, and the substrate layer is a P-type material, and wherein the at least one p-n junction comprises a non-forward biased p-n junction formed by the well in contact with the substrate layer.

17. The fuse structure of claim 10, wherein the diffusion material is an N-type material, the well is a first P-type material, and the substrate layer is a second P-type material, and wherein the at least one p-n junction comprises a non-forward biased p-n junction formed by the well in contact with the diffusion material.

18. A method of constructing a fuse structure for a semiconductor integrated circuit (IC), the method comprising:
    forming a well comprised of an N-type or a P-type material disposed within a substrate layer of the IC;
    disposing a diffusion material within the well;
    forming an anode, within the well, comprising conductive material overlaying the diffusion material;
    forming a cathode, within the well, comprising conductive material overlaying the diffusion material;

forming a fuse link, within the well, comprising conductive material overlaying the diffusion material, wherein a first end of the fuse link is coupled to the anode and a second end of the fuse link, that is distal to the first end, is coupled to the cathode; and creating at least one p-n junction that electrically isolates the diffusion material from the substrate layer, wherein the anode, the cathode, and the fuse link are not separated from the diffusion material by a dielectric layer.

19. The method of claim 18, further comprising:

forming a substrate tap comprising at least one substrate contact overlaying a region of the substrate layer; and forming a well tap comprising at least one contact overlaying a region of the well.

20. The method of claim 18, further comprising forming the anode, the cathode, and the fuse link directly above the diffusion material.

* * * * *